US011658235B2

(12) United States Patent
Kuraguchi et al.

(10) Patent No.: US 11,658,235 B2
(45) Date of Patent: May 23, 2023

(54) SEMICONDUCTOR DEVICE

(71) Applicant: Kabushiki Kaisha Toshiba, Minato-ku (JP)

(72) Inventors: Masahiko Kuraguchi, Yokohama (JP); Yosuke Kajiwara, Yokohama (JP); Miki Yumoto, Kawasaki (JP); Hiroshi Ono, Setagaya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/901,171

(22) Filed: Feb. 21, 2018

(65) Prior Publication Data

US 2019/0088771 A1   Mar. 21, 2019

(30) Foreign Application Priority Data

Sep. 20, 2017 (JP) .............................. JP2017-180610

(51) Int. Cl.
*H01L 29/778* (2006.01)
*H01L 29/423* (2006.01)
(Continued)

(52) U.S. Cl.
CPC ...... *H01L 29/7787* (2013.01); *H01L 23/4824* (2013.01); *H01L 23/5226* (2013.01);
(Continued)

(58) Field of Classification Search
CPC .................................................. H01L 29/7786
(Continued)

(56) References Cited

U.S. PATENT DOCUMENTS

2011/0133205 A1* 6/2011 Nagahisa ............ H01L 29/4236
257/76
2012/0119228 A1* 5/2012 Hsia ...................... H01L 33/642
257/88
(Continued)

FOREIGN PATENT DOCUMENTS

JP   2011-40597   2/2011
JP   2015-115582   6/2015
(Continued)

*Primary Examiner* — Hsin Yi Hsieh
(74) *Attorney, Agent, or Firm* — Oblon, McClelland, Maier & Neustadt, L.L.P.

(57) ABSTRACT

According to one embodiment, a semiconductor device includes a first electrode, a first region, and a first insulating layer. The first electrode includes a first electrode portion. The first region contains Ga and N. The first region includes a first subregion, a second subregion, and a third subregion. The first subregion and the third subregion contain at least one first element selected from the group consisting of Ar, B, P, N, and Fe. The first subregion is located between the first electrode portion and the second subregion in a first direction. The second subregion does not contain the first element, or concentration of the first element in the second subregion is lower than concentration of the first element in the first subregion and lower than concentration of the first element in the third subregion. The first insulating layer is provided between the first electrode and the first region.

17 Claims, 7 Drawing Sheets

(51) Int. Cl.
  *H01L 29/66*    (2006.01)
  *H01L 23/528*   (2006.01)
  *H01L 23/522*   (2006.01)
  *H01L 29/417*   (2006.01)
  *H01L 23/482*   (2006.01)
  *H01L 29/45*    (2006.01)
  *H01L 29/20*    (2006.01)

(52) U.S. Cl.
  CPC .... *H01L 23/5286* (2013.01); *H01L 29/41758* (2013.01); *H01L 29/4238* (2013.01); *H01L 29/42376* (2013.01); *H01L 29/66462* (2013.01); *H01L 29/66522* (2013.01); *H01L 29/7783* (2013.01); *H01L 29/7786* (2013.01); *H01L 29/2003* (2013.01); *H01L 29/4236* (2013.01); *H01L 29/452* (2013.01)

(58) Field of Classification Search
  USPC .......................................................... 257/76
  See application file for complete search history.

(56) References Cited

U.S. PATENT DOCUMENTS

| | | | |
|---|---|---|---|
| 2014/0175453 A1* | 6/2014 | Yamada | H01L 29/7785 257/76 |
| 2015/0171204 A1 | 6/2015 | Nakayama et al. | |
| 2015/0179741 A1 | 6/2015 | Umeda et al. | |
| 2016/0064502 A1* | 3/2016 | Oka | H01L 29/66462 257/411 |
| 2016/0284831 A1 | 9/2016 | Shindome et al. | |
| 2017/0148906 A1* | 5/2017 | Iucolano | H01L 21/0254 |
| 2018/0097070 A1* | 4/2018 | Miura | H01L 29/94 |
| 2018/0261681 A1* | 9/2018 | Yonehara | H01L 29/51 |
| 2018/0286945 A1* | 10/2018 | Oka | H01L 29/2003 |

FOREIGN PATENT DOCUMENTS

| | | |
|---|---|---|
| JP | 2016-181570 | 10/2016 |
| JP | 2017-157589 A | 9/2017 |
| WO | WO 2014/041731 A1 | 3/2014 |

* cited by examiner

SEMICONDUCTOR DEVICE

CROSS-REFERENCE TO RELATED APPLICATIONS

This application is based upon and claims the benefit of priority from Japanese Patent Application No. 2017-180610, filed on Sep. 20, 2017; the entire contents of which are incorporated herein by reference.

FIELD

Embodiments described herein relate generally to a semiconductor device.

BACKGROUND

There is known a semiconductor device containing a semiconductor including e.g. Ga and N. Improvement in the operating speed of the semiconductor device is desired.

DETAILED DESCRIPTION

Figure 1:
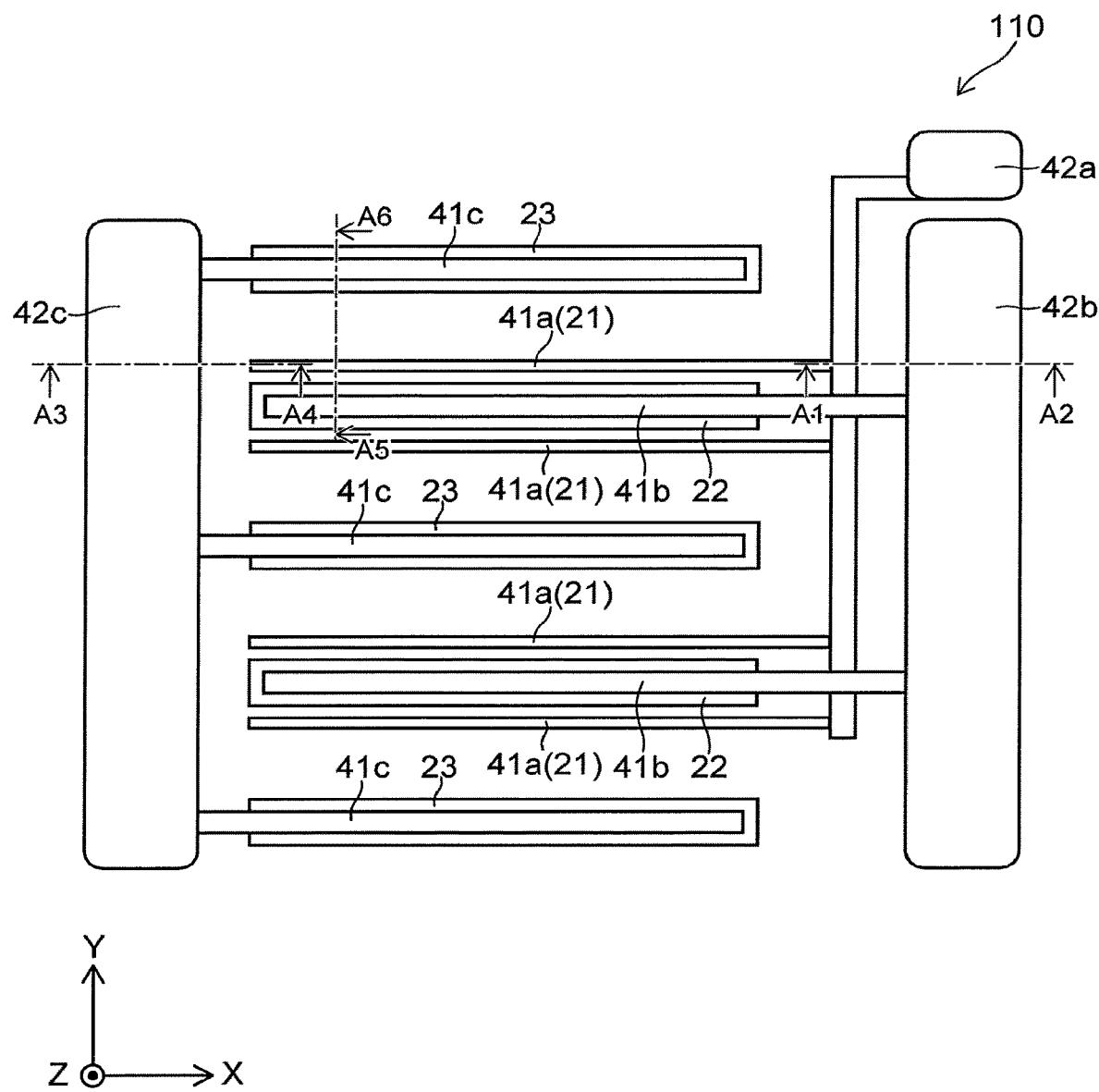
FIG. 1 is a schematic plan view illustrating a semiconductor device according to an embodiment.

According to one embodiment, a semiconductor device includes a first electrode, a first region, and a first insulating layer. The first electrode includes a first electrode portion. The first region contains Ga and N. The first region includes a first subregion, a second subregion, and a third subregion. The first subregion contains at least one first element selected from the group consisting of Ar, B, P, N, and Fe. The first subregion is located between the first electrode portion and the second subregion in a first direction. The third subregion contains the first element. Direction from the second subregion to the third subregion lies along a second direction crossing the first direction. Direction from the third subregion to the first electrode portion crosses the first direction and the second direction. The second subregion does not contain the first element, or concentration of the first element in the second subregion is lower than concentration of the first element in the first subregion and lower than concentration of the first element in the third subregion. The first insulating layer is provided between the first electrode and the first region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

FIG. 1 is a schematic plan view illustrating a semiconductor device according to an embodiment.

Figure 2A:
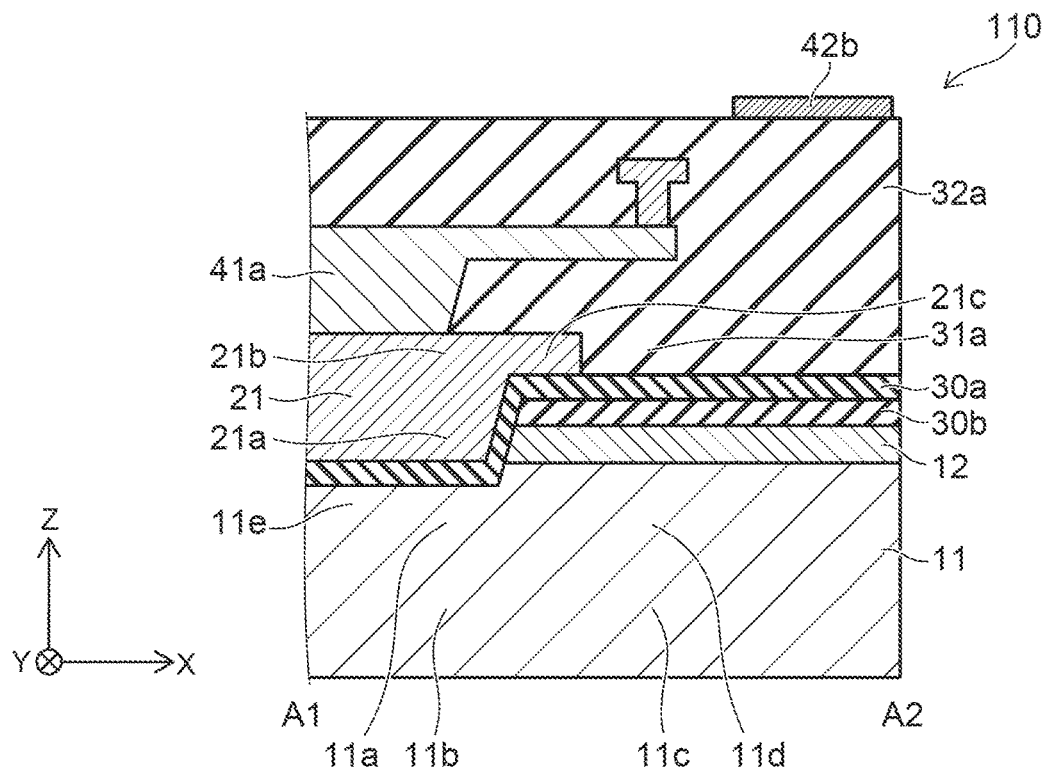
FIGS. 2A, 2B, and 3 are schematic sectional views illustrating the semiconductor device according to the embodiment.
Figure 2B:
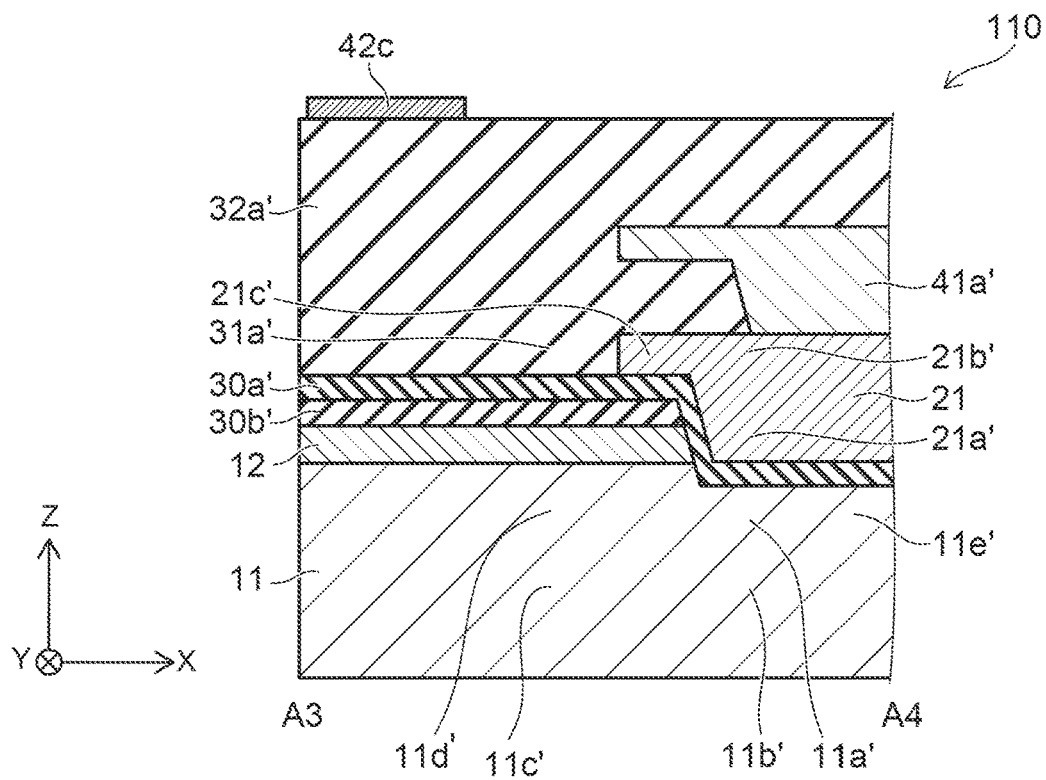
Figure 3:
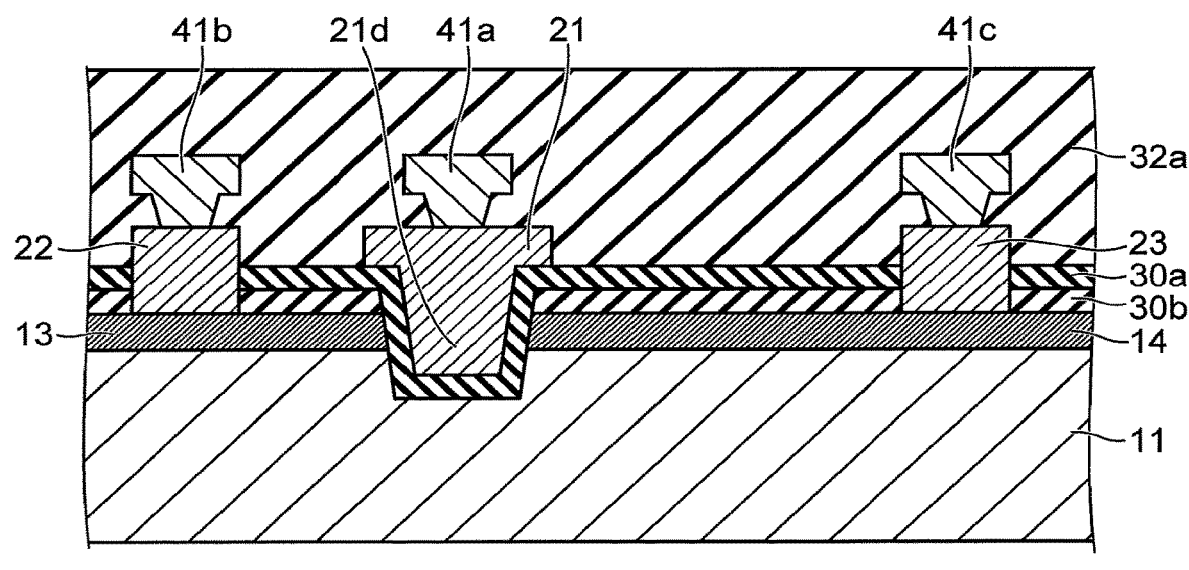

FIGS. 2A, 2B, and 3 are schematic sectional views illustrating the semiconductor device according to the embodiment. FIG. 2A is a sectional view taken along line A1-A2 of FIG. 1. FIG. 2B is a sectional view taken along line A3-A4 of FIG. 1. In FIG. 2B reference numerals corresponding with 11a, 11b, 11c, 11d, 11e, 21a, 21b, 21c, 30a, 30b, 31a, 32a, and 41a in FIG. 2A are shown as reference numerals 11a', 11b', 11c', 11d', 11e', 21a', 21b', 21c', 30a', 30b', 31a', 32a' and 41a' in FIG. 2B. FIG. 3 is a sectional view taken along line A5-A6 of FIG. 1.

As shown in FIGS. 1, 2A, and 3, the semiconductor device 110 according to the embodiment includes a first region 11, a second region 12, a third region 13, a fourth region 14, a first electrode 21, a second electrode 22, a third electrode 23, a first insulating layer 30a, a second insulating layer 30b, and a first insulating region 31a.

As shown in FIG. 2A, the first region 11 includes a first subregion 11a, a second subregion 11b, a third subregion 11c, a fourth subregion 11d, and a fifth subregion 11e. The first electrode 21 includes a first electrode portion 21a, a second electrode portion 21b, and a third electrode portion 21c.

The first subregion 11a is located between the second subregion 11b and the first electrode portion 21a in a first direction. The first electrode portion 21a is located between the first subregion 11a and the second electrode portion 21b in the first direction.

The first direction lies along e.g. the Z-axis direction shown in FIG. 1. One direction perpendicular to the Z-axis direction is referred to as X-axis direction. The direction perpendicular to the X-axis direction and the Z-axis direction is referred to as Y-axis direction. A direction crossing the first direction is referred to as second direction. The second direction lies along e.g. the X-axis direction. A direction crossing the first direction and the second direction is referred to as third direction. The third direction lies along e.g. the Y-axis direction.

The following describes the case where the first direction, the second direction, and the third direction lie along the Z-axis direction, the X-axis direction, and the Y-axis direction, respectively.

The direction from the second subregion 11b to the third subregion 11c lies along the X-axis direction. The direction from the third subregion 11c to the first electrode portion 21a lies along a plane including the X-axis direction and the Z-axis direction and crosses the X-axis direction and the Z-axis direction.

The direction from the first subregion 11a to the fourth subregion 11d lies along the X-axis direction. The direction from the third subregion 11c to the fourth subregion 11d lies along the Z-axis direction. The first subregion 11a is located between the fourth subregion 11d and the fifth subregion 11e in the X-axis direction.

The first region 11 contains Ga and N. The first subregion 11a, the third subregion 11c, and the fourth subregion 11d contain at least one first element selected from the group consisting of Ar, B, P, N, and Fe. For instance, the concentration of the first element in the third subregion 11c is higher than the concentration of the first element in the first subregion 11a. For instance, the density of crystal defects in the third subregion 11c is larger than the density of crystal defects in the first subregion 11a. For instance, the electric resistance in the third subregion 11c is higher than the electric resistance in the first subregion 11a.

The second subregion 11b does not contain the first element. The second subregion 11b may contain the first element. In this case, the concentration of the first element in the second subregion 11b is lower than the concentration of the first element in the first subregion 11a, and lower than the concentration of the first element in the third subregion 11c.

For instance, the density of crystal defects in the second subregion 11b is smaller than the density of crystal defects in the first subregion 11a, and smaller than the density of crystal defects in the third subregion 11c. For instance, the electric resistance in the second subregion 11b is lower than the electric resistance in the first subregion 11a, and lower than the electric resistance in the third subregion 11c.

The fifth subregion 11e does not contain the first element. The fifth subregion 11e may contain the first element. In this case, the concentration of the first element in the fifth subregion 11e is lower than the concentration of the first element in the first subregion 11a, and lower than the concentration of the first element in the third subregion 11c.

For instance, the density of crystal defects in the fifth subregion 11e is smaller than the density of crystal defects in the first subregion 11a. For instance, the electric resistance in the fifth subregion 11e is lower than the electric resistance in the first subregion 11a.

The second region 12 contains Al, Ga, and N. The second region 12 contains the first element. The direction from the first electrode portion 21a to the second region 12 lies along the X-axis direction. The fourth subregion 11d is located between the third subregion 11c and the second region 12 in the Z-axis direction. For instance, the concentration of the first element in the second region 12 is higher than the concentration of the first element in the fourth subregion 11d.

The position in the X-axis direction of the third electrode portion 21c is located between the position in the X-axis direction of the first subregion 11a and the position in the X-axis direction of the third subregion 11c. The direction from part of the second region 12 to the third electrode portion 21c lies along the Z-axis direction.

The direction from the third subregion 11c to the first insulating region 31a lies along the Z-axis direction. The fourth subregion 11d and the second region 12 are located between the third subregion 11c and the first insulating region 31a in the Z-axis direction. The direction from the second electrode portion 21b to the first insulating region 31a lies along the X-axis direction.

The fourth region 14 is spaced from the third region 13 in the Y-axis direction. The first electrode 21 includes a fourth electrode portion 21d located between the third region 13 and the fourth region 14 in the Y-axis direction. The direction from the fourth electrode portion 21d to the first electrode portion 21a lies along the X-axis direction. The direction from the fifth subregion 11e to the fourth electrode portion 21d lies along the Z-axis direction. The third region 13 and the fourth region 14 may be spaced from the second region 12 or connected to the second region 12.

The first insulating layer 30a is provided between the first region 11 and the first electrode 21. The first insulating layer 30a is located between the second region 12 and the first electrode 21, between the third region 13 and the first electrode 21, and between the fourth region 14 and the first electrode 21. The second insulating layer 30b is provided between the second region 12 and the first insulating layer 30a, between the third region 13 and the first insulating layer 30a, and between the fourth region 14 and the first insulating layer 30a in the Z-axis direction. The first insulating layer 30a contains e.g. Si and O. The first insulating layer 30a may contain Al and O. The second insulating layer 30b contains e.g. Si and N.

The second electrode 22 is electrically connected to the third region 13. The direction from the third region 13 to the second electrode 22 lies along the Z-axis direction. The third electrode 23 is electrically connected to the fourth region 14. The direction from the fourth region 14 to the third electrode 23 lies along the Z-axis direction.

As shown in FIG. 1, the length in the X-axis direction of the first electrode 21 is longer than the length in the Y-axis direction of the first electrode 21. The length in the X-axis direction of the second electrode 22 is longer than the length in the Y-axis direction of the second electrode 22. The length in the X-axis direction of the third electrode 23 is longer than the length in the Y-axis direction of the third electrode 23.

For instance, the semiconductor device 110 includes an insulating region 32a, a first interconnect part 41a, a second interconnect part 41b, a third interconnect part 41c, a first conductive part 42a, a second conductive part 42b, and a third conductive part 42c.

The position in the Z-axis direction of the first interconnect part 41a is located between the position in the Z-axis direction of the first electrode 21 and the position in the Z-axis direction of the first conductive part 42a. The position in the Z-axis direction of the second interconnect part 41b is located between the position in the Z-axis direction of the second electrode 22 and the position in the Z-axis direction of the second conductive part 42b. The position in the Z-axis direction of the third interconnect part 41c is located between the position in the Z-axis direction of the third electrode 23 and the position in the Z-axis direction of the third conductive part 42c.

The first conductive part 42a is spaced from the second conductive part 42b in e.g. the Y-axis direction. The third conductive part 42c is spaced from the second conductive part 42b in e.g. the X-axis direction. The first electrode 21 is electrically connected to the first conductive part 42a through the first interconnect part 41a. The second electrode 22 is electrically connected to the second conductive part 42b through the second interconnect part 41b. The third electrode 23 is electrically connected to the third conductive part 42c through the third interconnect part 41c. The insulating region 32a is provided around the first interconnect part 41a, around the second interconnect part 41b, and around the third interconnect part 41c.

For instance, as shown in FIG. 1, each of the first electrode 21, the second electrode 22, and the third electrode 23 is provided in a plurality in the Y-axis direction. For instance, each of the first interconnect part 41a, the second interconnect part 41b, and the third interconnect part 41c is provided in a plurality. The plurality of first electrodes 21 are electrically connected to the first conductive part 42a through the plurality of first interconnect parts 41a, respectively. The plurality of second electrodes 22 are electrically connected to the second conductive part 42b through the plurality of second interconnect parts 41b, respectively. The plurality of third electrodes 23 are electrically connected to the third conductive part 42c through the plurality of third interconnect parts 41c, respectively.

The first electrode 21 contains e.g. Ti and N. The second electrode 22 and the third electrode 23 contain e.g. at least one selected from the group consisting of Ti and Al. The first interconnect part 41a, the second interconnect part 41b, the third interconnect part 41c, the first conductive part 42a, the second conductive part 42b, and the third conductive part 42c contain e.g. at least one selected from the group consisting of Cu, Al, Ni, W, and Ti.

For instance, the second electrode 22 is set to a second potential. The third electrode 23 is set to a third potential. For instance, the second potential is the ground potential. The third potential is higher than the second potential. For instance, a two-dimensional electron gas exists in the boundary portion between the first region 11 and the third region 13 and the boundary portion between the first region 11 and the fourth region 14. The first electrode 21 is set to a first potential. When the first potential exceeds a threshold, a current flows between the second electrode 22 and the third electrode 23.

The embodiment can improve the operating speed of the semiconductor device. This is based on e.g. the reduction of the number of electrons trapped in the second subregion 11b. The reduction of the number of trapped electrons is based on e.g. at least one of the following.

For instance, the second subregion 11b does not contain the first element. Alternatively, the second subregion 11b may contain the first element. In this case, the concentration of the first element in the second subregion 11b is lower than the concentration of the first element in the first subregion 11a, and lower than the concentration of the first element in the third subregion 11c.

For instance, the density of crystal defects in the second subregion 11b is smaller than the density of crystal defects in the first subregion 11a, and smaller than the density of crystal defects in the third subregion 11c.

For instance, the electric resistance in the second subregion 11b is lower than the electric resistance in the first subregion 11a, and lower than the electric resistance in the third subregion 11c.

The concentration of the first element in the first subregion 11a is preferably $10^{18}$ atoms/cm$^3$ or more and $10^{20}$ atoms/cm$^3$ or less. In the case where the second subregion 11b contains the first element, the concentration of the first element in the second subregion 11b is preferably $10^{17}$ atoms/cm$^3$ or more and $10^{19}$ atoms/cm$^3$ or less. The concentration of the first element in each of the third subregion 11c and the fourth subregion 11d is preferably $10^{19}$ atoms/cm$^3$ or more and $10^{21}$ atoms/cm$^3$ or less.

Figure 4A:
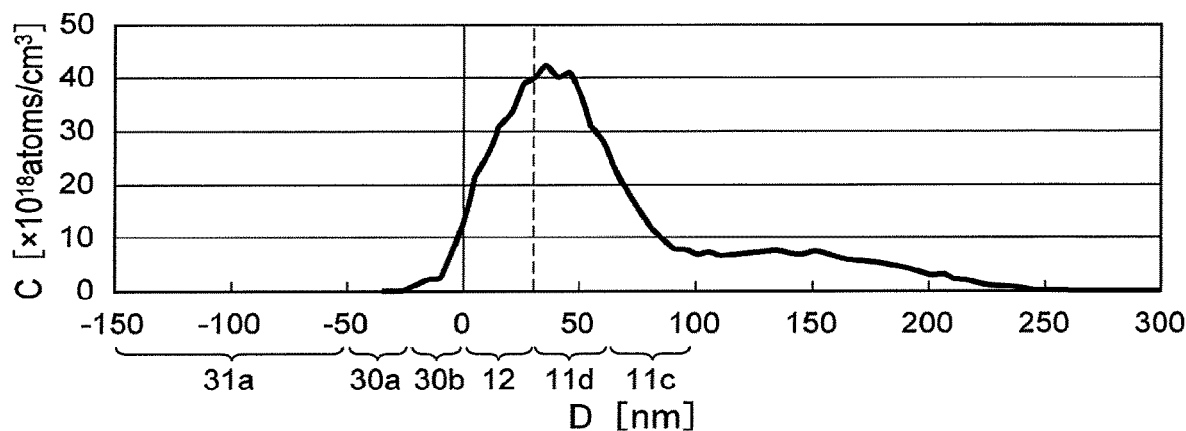
FIGS. 4A and 4B are simulation results illustrating the characteristics of the semiconductor device according to the embodiment.
Figure 4B:
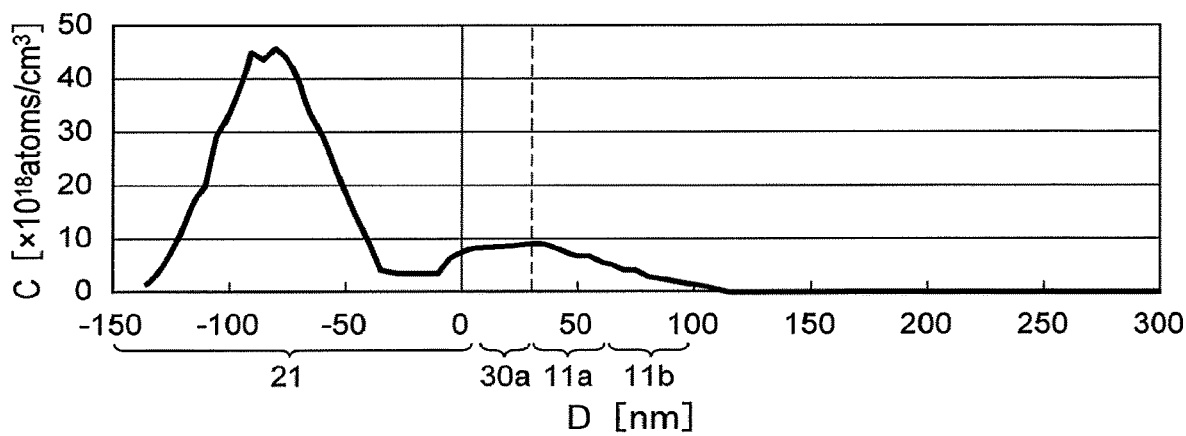

FIGS. 4A and 4B are simulation results illustrating the characteristics of the semiconductor device according to the embodiment.

FIG. 4A shows the concentration distribution of the first element on a first line segment including the first insulating region 31a, the first insulating layer 30a, the second insulating layer 30b, the second region 12, the fourth subregion 11d, and the third subregion 11c. FIG. 4B shows the concentration distribution of the first element on a second line segment including the first electrode 21, the first insulating layer 30a, the second insulating layer 30b, the first subregion 11a, and the second subregion 11b. The first line segment and the second line segment lie along the Z-axis direction. In FIGS. 4A and 4B, the horizontal axis represents depth D [nm], and the vertical axis represents concentration C [×$10^{18}$ atoms/cm$^3$].

The result of FIG. 4A indicates that the concentration of the first element in the fourth subregion 11d is higher than the concentration of the first element in the third subregion 11c. The result of FIG. 4B indicates that the concentration of the first element in the second subregion 11b is lower than the concentration of the first element in the first subregion 11a. The results of FIGS. 4A and 4B indicate that the concentration of the first element in the second subregion 11b is lower than the concentration of the first element in the third subregion 11c. The results indicate that the concentration of the first element in the first subregion 11a is lower than the concentration of the first element in the fourth subregion 11d.

Figure 5A:
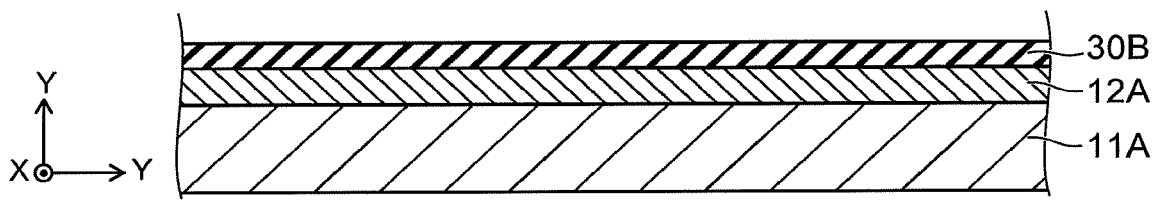
FIGS. 5A to 5E are schematic sectional views illustrating a method for manufacturing the semiconductor device according to the embodiment.
Figure 5B:
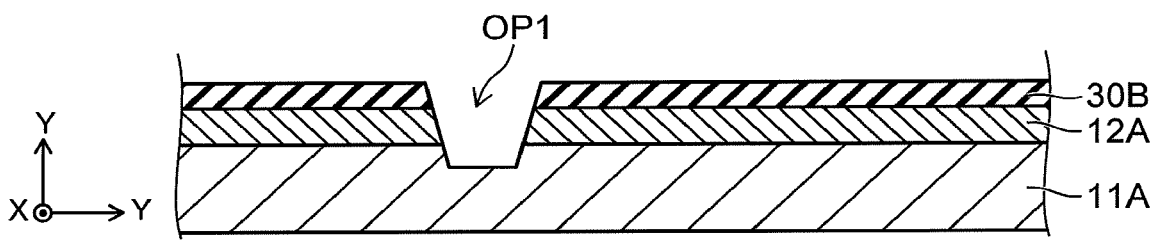
Figure 5C:
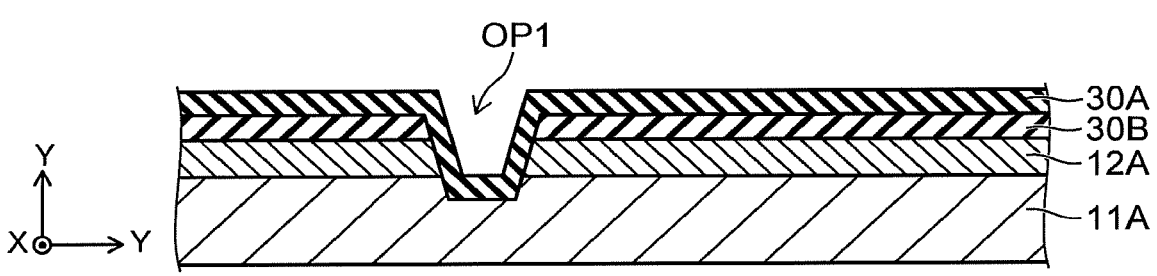
Figure 5D:
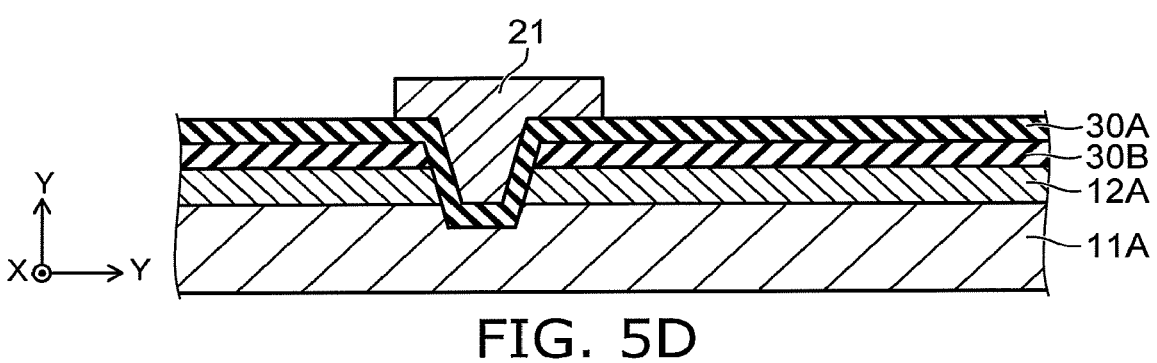
Figure 5E:
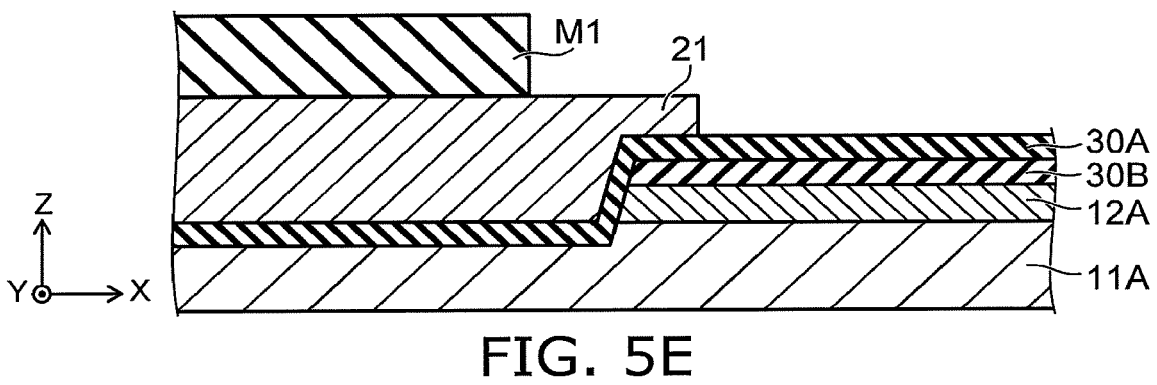

FIGS. 5A to 5E are schematic sectional views illustrating a method for manufacturing the semiconductor device according to the embodiment. FIGS. 5A to 5D illustrate the manufacturing process of the portion corresponding to the cross section taken along line A5-A6 of FIG. 1. FIG. 5E illustrates the manufacturing process of the portion corresponding to the cross section taken along line A1-A2 of FIG. 1.

A semiconductor layer 11A containing Ga and N is formed. A semiconductor layer 12A containing Al, Ga, and N is formed on the semiconductor layer 11A. The semiconductor layer 11A and the semiconductor layer 12A are formed by e.g. metal organic chemical vapor deposition (MOCVD). As shown in FIG. 5A, an insulating layer 30B is formed on the semiconductor layer 12A. The insulating layer 30B contains e.g. Si and N. The insulating layer 30B is formed by e.g. chemical vapor deposition (CVD).

As shown in FIG. 5B, an opening OP1 penetrating through the insulating layer 30B and the semiconductor layer 12A is formed. The opening OP1 extends in the X-axis direction. As shown in FIG. 5C, an insulating layer 30A is formed on the inner wall of the opening OP1 and the upper surface of the insulating layer 30B. The insulating layer 30A is formed by e.g. chemical vapor deposition (CVD) or atomic layer deposition (ALD).

A conductive layer is formed on the insulating layer 30A. This conductive layer contains e.g. Ti and N. This conductive layer is formed by e.g. sputtering a target containing Ti and N. The opening OP1 is buried in this conductive layer. Part of this conductive layer is removed. This removing step is performed using e.g. chemical dry etching (CDE), reactive ion etching (RIE), or wet etching. Thus, as shown in FIG. 5D, a first electrode 21 is formed at the position where the opening OP1 was formed.

As shown in FIG. 5E, a mask M1 is formed on part of the first electrode 21. The semiconductor layer 11A and the semiconductor layer 12A are implanted with ions of the first element. Part of the semiconductor layer 11A is ion-implanted through the insulating layer 30A and the insulating layer 30B. A different part of the semiconductor layer 11A is ion-implanted through the insulating layer 30A and the first electrode 21. A still different part of the semiconductor layer 11A is ion-implanted through the insulating layer 30A, the first electrode 21, and the mask M1. The injection of ions of the first element into the semiconductor layer 11A forms first to fifth subregions 11a-11e.

Subsequently, an insulating region 32a, a first interconnect part 41a, a second interconnect part 41b, a third interconnect part 41c, a first conductive part 42a, a second conductive part 42b, and a third conductive part 42c are formed on the first to third electrodes 21-23. Thus, the semiconductor device 110 shown in FIGS. 1 to 3 is fabricated.

Figure 6A:
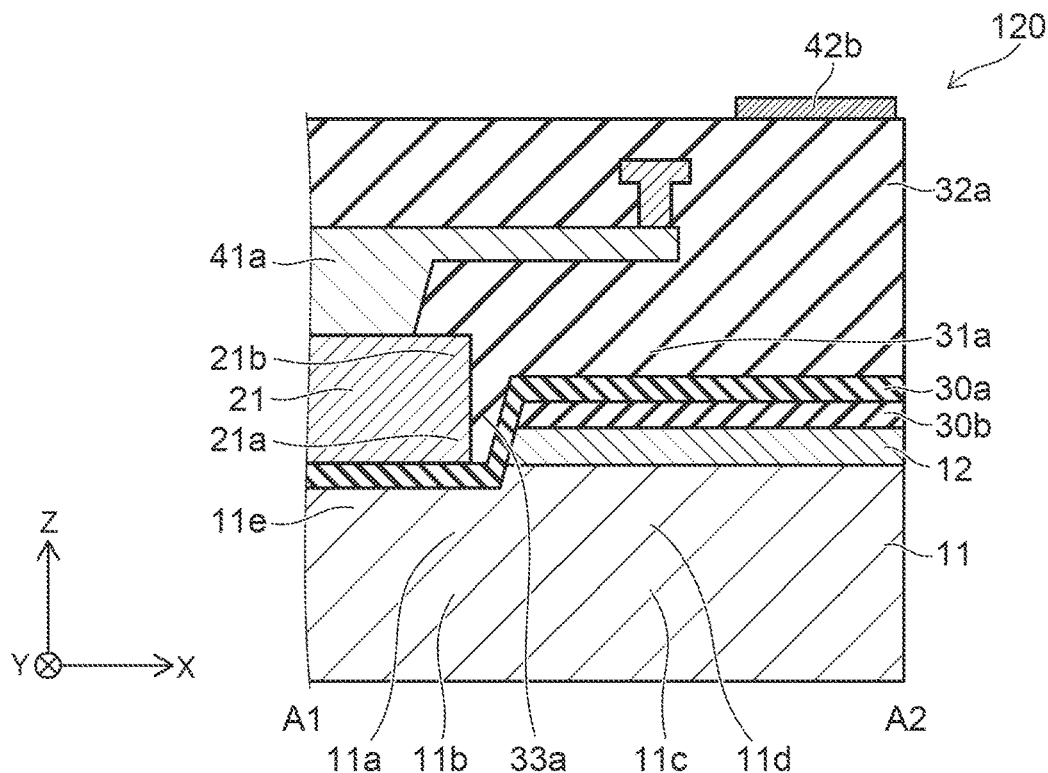
FIGS. 6A and 6B are schematic sectional views showing an alternative semiconductor device according to the embodiment.
Figure 6B:
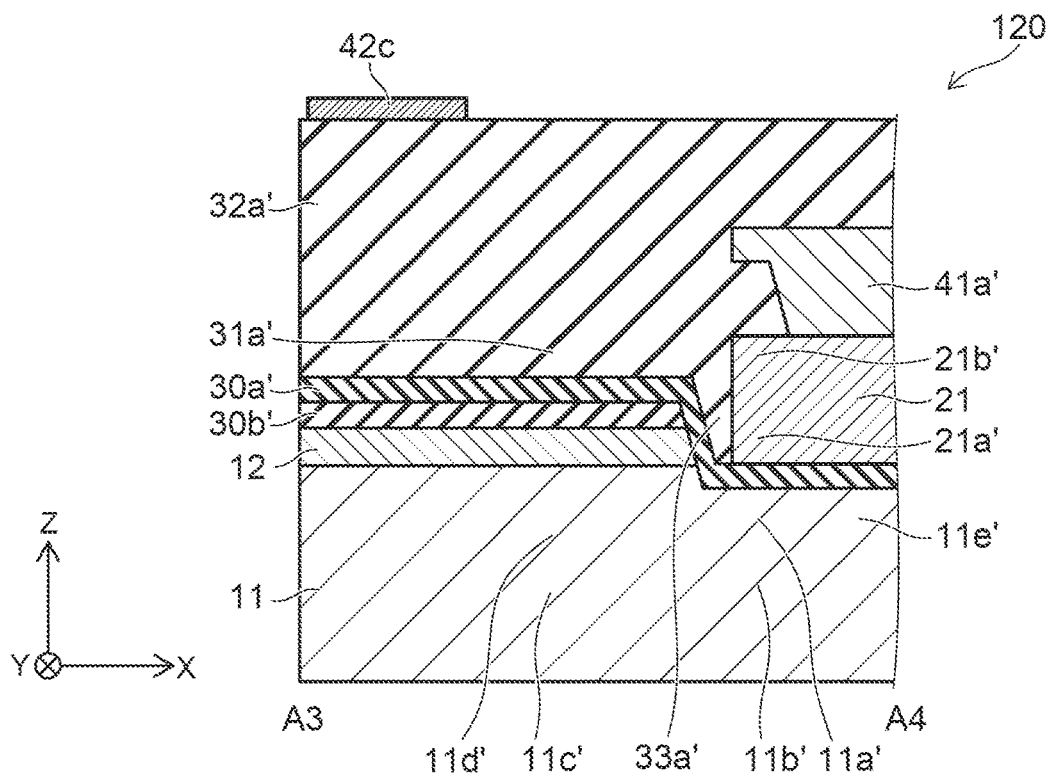

FIGS. 6A and 6B are schematic sectional views showing an alternative semiconductor device according to the embodiment.

The semiconductor device 120 shown in FIG. 6A includes an insulating region 33a. The insulating region 33a is located between the first electrode 21 and the second region 12 and between the first electrode 21 and part of the first insulating layer 30a in the X-axis direction. For instance, the fourth subregion 11d is located between the third subregion 11c and the insulating region 33a in the Z-axis direction.

In the semiconductor device 120, the first region 11 includes a second subregion 11b as in the semiconductor device 110. This can improve the operating speed of the semiconductor device 120.

The semiconductor device 120 shown in FIG. 6B includes an insulating region 33a'. The insulating region 33a' is located between the first electrode 21 and the second region 12 and between the first electrode 21 and part of the first insulating layer 30a' in the X-axis direction. For instance, the fourth subregion 11d' is located between the third subregion 11c' and the insulating region 33a' in the Z-axis direction.

In the semiconductor device 120, the first region 11 includes a second subregion 11b' as in the semiconductor device 110. This can improve the operating speed of the semiconductor device 120.

Figure 7A:
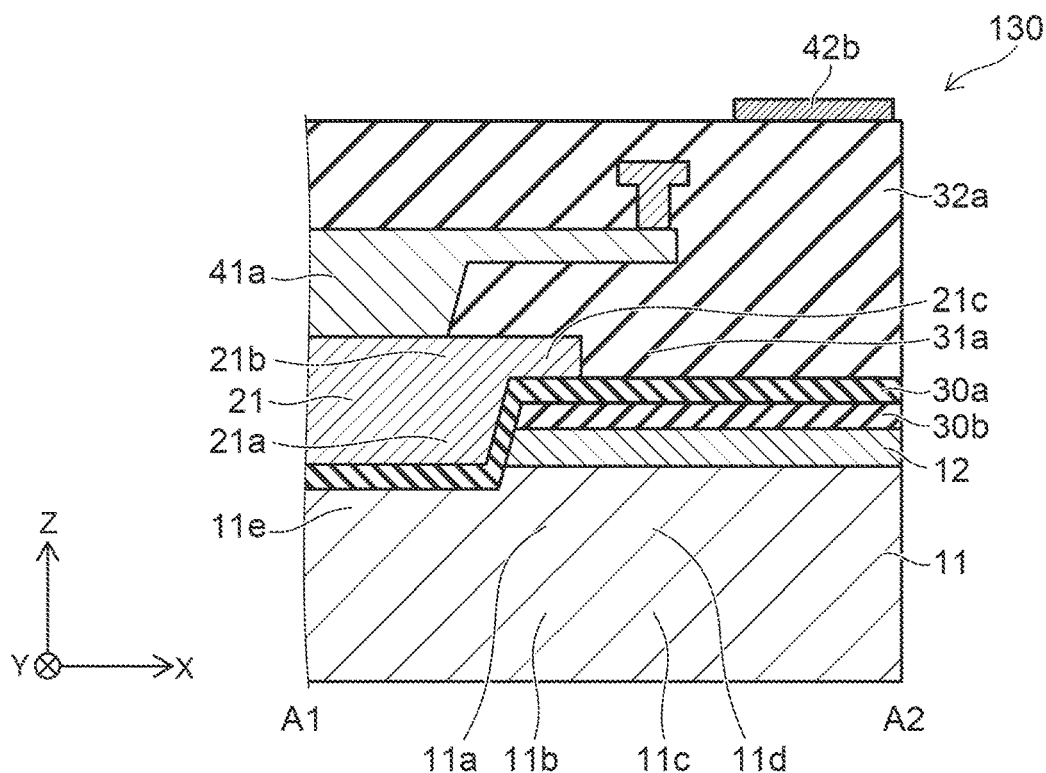
FIGS. 7A and 7B are schematic sectional views showing an alternative semiconductor device according to the embodiment.

FIG. 7A is a schematic sectional view showing an alternative semiconductor device according to the embodiment.

In the semiconductor device 130 shown in FIG. 7A, the first subregion 11a is located between the third electrode portion 21c and the second subregion 11b in the Z-axis direction. Part of the second insulating layer 30b is located between the first subregion 11a and the third electrode portion 21c in the Z-axis direction. The position in the X-axis direction of the first subregion 11a is located between the position in the X-axis direction of the first electrode portion 21a and the position in the X-axis direction of the third subregion 11c.

Figure 7B:
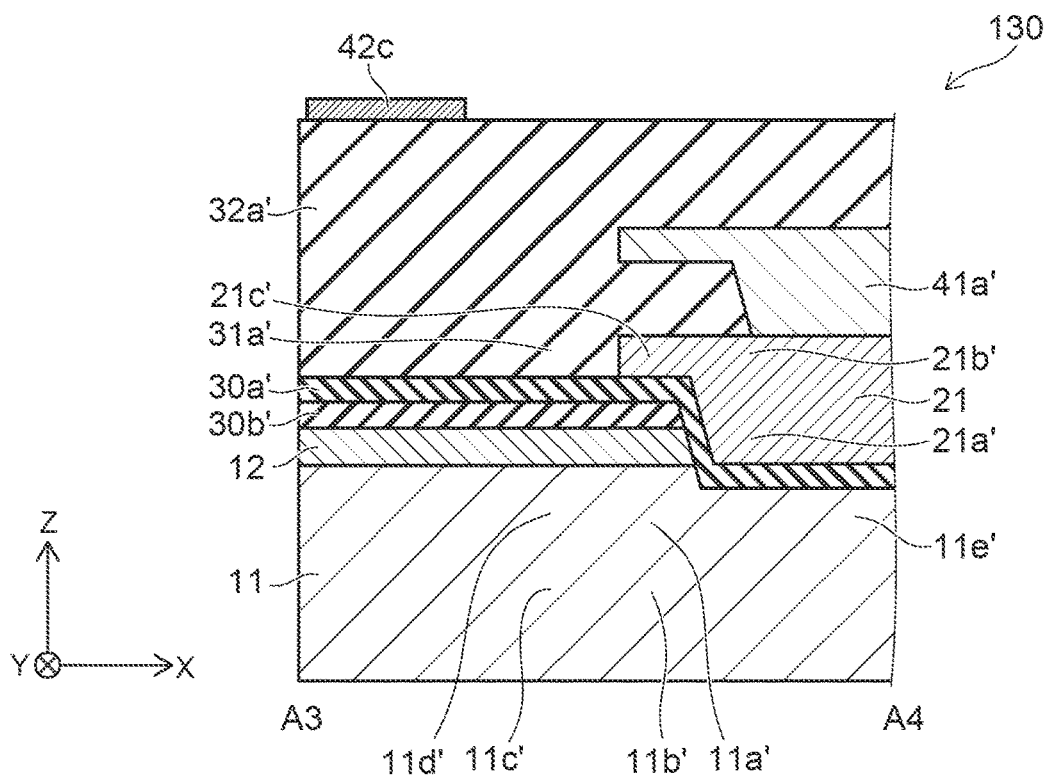

FIG. 7B is a schematic sectional view showing an alternative semiconductor device according to the embodiment.

In the semiconductor device 130 shown in FIG. 7B, the first subregion 11a' is located between the third electrode portion 21c' and the second subregion 11b' in the Z-axis direction. Part of the second insulating layer 30b' is located between the first subregion 11a' and the third electrode portion 21c' in the Z-axis direction. The position in the X-axis direction of the first subregion 11a' is located between the position in the X-axis direction of the first electrode portion 21a' and the position in the X-axis direction of the third subregion 11c'.

The embodiments described above can provide a semiconductor device capable of improving the operating speed.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the first region to the fourth region, the insulating layers, the insulating regions, the electrode, the interconnect parts, the conductive parts, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first electrode including a first electrode portion;
a first region containing Ga and N; and
a first insulating layer provided between the first electrode and the first region,
wherein the first region includes:
a first subregion containing a first element comprising at least one element selected from a group consisting of Ar, B, P, N, and Fe;
a second subregion, the first subregion being located between the first electrode portion and the second subregion in a first direction; and
a third subregion containing the first element, a direction from the second subregion to the third subregion lying along a second direction crossing the first direction, and a direction from the third subregion to the first electrode portion crossing the first direction and the second direction, the second direction being along a boundary between the first region and the first insulating layer at a bottommost portion of the first insulating layer, and
wherein the second subregion does not contain the first element, or wherein a concentration of the first element in the second subregion is lower than a concentration of the first element in the first subregion and lower than a concentration of the first element in the third subregion,
wherein on a line passing through the second subregion and the first subregion and being along the first direction, a concentration of the first element has a peak at a first position in the first electrode,
wherein a concentration of the first element in a second position is lower than the concentration of the first element in the first subregion, and
wherein the second position is between the first position and the first subregion.

2. The device according to claim 1, further comprising:
a first insulating region,
wherein:
a direction from the third subregion to the first insulating region lies along the first direction;

the first electrode includes a second electrode portion;
the first electrode portion is located between the first subregion and the second electrode portion in the first direction; and
a direction from the first insulating region to the second electrode portion lies along the second direction.

3. The device according to claim 1, wherein:
the first region includes a fourth subregion containing the first element;
a direction from the first subregion to the fourth subregion lies along the second direction;
a direction from the third subregion to the fourth subregion lies along the first direction; and
a concentration of the first element in the fourth subregion is higher than the concentration of the first element in the third subregion.

4. The device according to claim 1, further comprising:
a second region containing Al, Ga, and N,
wherein a direction from the first electrode portion to the second region lies along the second direction.

5. The device according to claim 4, wherein
the first electrode includes a third electrode portion, wherein:
the third electrode portion is located between the second subregion and the third subregion in the second direction when viewed from the first direction, and
a direction from a part of the second region to the third electrode portion lies along the first direction.

6. The device according to claim 4, wherein:
the second region contains the first element; and
a concentration of the first element in the second region is higher than the concentration of the first element in the first subregion and higher than the concentration of the first element in the third subregion.

7. The device according to claim 4, further comprising:
a second insulating layer provided between a part of the first insulating layer and the second region in the first direction;
wherein:
the first insulating layer contains Si and O; and
the second insulating layer contains Si and N.

8. The device according to claim 1, further comprising:
a third region containing Al, Ga, and N;
a fourth region containing AL Ga, and N, a first portion of the first electrode being between the third region and the fourth region in a third direction crossing a plane including the first direction and the second direction;
a second electrode being electrically connected to the third region; and
a third electrode being electrically connected to the fourth region.

9. The device according to claim 8, wherein
a direction from a part of the third region to the second electrode lies along the first direction, and
a direction from a part of the fourth region to the third electrode lies along the first direction.

10. The device according to claim 8, wherein the second electrode and the third electrode contain at least one selected from a group consisting of Al and Ti.

11. The device according to claim 1, wherein
the first region includes a fifth subregion;
the first subregion is located between the third subregion and the fifth subregion in the second direction when viewed from the first direction; and
the fifth subregion does not contain the first element, or a concentration of the first element in the fifth subregion is lower than the concentration of the first element in the first subregion.

12. The device according to claim 1, wherein:
the concentration of the first element in the first subregion is $10^{18}$ atoms/cm$^3$ or more and $10^{20}$ atoms/cm$^3$ or less; and
the concentration of the first element in the second subregion is $10^{17}$ atoms/cm$^3$ or more and $10^{19}$ atoms/cm$^3$ or less.

13. The device according to claim 1, wherein the first electrode contains Ti and N.

14. The device according to claim 1, wherein the line passes through the first electrode portion.

15. A semiconductor device comprising:
a first electrode including a third electrode portion;
a first region containing Ga and N; and
a first insulating layer provided between the first electrode and the first region,
wherein the first region includes:
a first subregion containing a first element comprising at least one element selected from a group consisting of Ar, B, P, N, and Fe;
a second subregion, the first subregion being located between the third electrode portion and the second subregion in a first direction; and
a third subregion containing the first element, a direction from the second subregion to the third subregion lying along a second direction crossing the first direction, and a direction from the third subregion to the third electrode portion crossing the first direction and the second direction, the second direction being along a boundary between the first region and the first insulating layer at a bottommost portion of the first insulating layer,
wherein the second subregion does not contain the first element, or wherein a concentration of the first element in the second subregion is lower than a concentration of the first element in the first subregion and lower than a concentration of the first element in the third subregion,
wherein on a line passing through the second subregion and the first subregion and being along the first direction, a concentration of the first element has a peak at a first position in the first electrode,
wherein a concentration of the first element in a second position is lower than the concentration of the first element in the first subregion, and
wherein the second position is between the first position and the first subregion.

16. The device according to claim 15, further comprising:
a second region containing Al, Ga, and N,
wherein a direction from a first electrode portion to the second region lies along the second direction,
the third electrode portion is located between the second subregion and the third subregion in the second direction when viewed from the first direction, and a direction from a part of the second region to the third electrode portion lies along the first direction.

17. The device according to claim 16, wherein the line passes through the first electrode portion.

* * * * *